(12) United States Patent
Spry et al.

(10) Patent No.: US 10,490,550 B1
(45) Date of Patent: Nov. 26, 2019

(54) LARGER-AREA INTEGRATED ELECTRICAL METALLIZATION DIELECTRIC STRUCTURES WITH STRESS-MANAGED UNIT CELLS FOR MORE CAPABLE EXTREME ENVIRONMENT SEMICONDUCTOR ELECTRONICS

(71) Applicant: United States of Americas as represented by the Administrator of NASA, Washington, DC (US)

(72) Inventors: David J. Spry, Medina, OH (US); Philip G. Neudeck, Olmstead Township, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 2 days.

(21) Appl. No.: 15/438,077

(22) Filed: Feb. 21, 2017

Related U.S. Application Data

(60) Provisional application No. 62/297,381, filed on Feb. 19, 2016.

(51) Int. Cl.
   *H01L 27/08* (2006.01)
   *H01L 49/02* (2006.01)

(52) U.S. Cl.
   CPC .......... *H01L 27/0805* (2013.01); *H01L 28/75* (2013.01)

(58) Field of Classification Search
   CPC . H01L 27/0805; H01L 28/75; H01L 51/0018; H01L 21/02601–21/02606; H01L 21/0273–0279; H01L 21/312–3128; H01L 2924/13061; H01L 2933/0083; H01L 2221/1094; G03F 7/115; G03F 7/16–18; G03F 7/20–24; G03F 7/70; G03F 7/26; H05K 2203/05; Y10S 977/938; Y10S 977/762–772; Y10S 977/842–848; B81C 1/00031; B81C 1/003; B82B 1/00–008; B82B 3/00–0095
   See application file for complete search history.

(56) References Cited

U.S. PATENT DOCUMENTS

| | | | |
|---|---|---|---|
| 3,961,414 A | 6/1976 | Humphreys | |
| 4,348,804 A | 9/1982 | Ogawa et al. | |
| 4,525,733 A | 6/1985 | Losee | |
| 4,695,868 A | 9/1987 | Fisher | |
| 5,358,733 A | 10/1994 | Lur et al. | |
| 8,227,926 B2 | 7/2012 | Topacio et al. | |
| 8,299,632 B2 | 10/2012 | Topacio et al. | |
| 8,736,054 B2 | 5/2014 | Schneegans et al. | |
| 2008/0026562 A1 | 1/2008 | Test | |

(Continued)

*Primary Examiner* — Moazzam Hossain
*Assistant Examiner* — Stanetta D Isaac
(74) *Attorney, Agent, or Firm* — Robert H. Earp, III; William M. Johnson

(57) ABSTRACT

A process of fabrication and the resulting microelectronic device that realizes metal features with larger lateral areas to maintain damage-free integrity over larger temperature ranges. The process and device enable the realization of highly durable extreme-environment microelectronic integrated circuits with increased functional capability, including realization of larger-area on-chip integrated metal-insulator-metal capacitor devices.

14 Claims, 11 Drawing Sheets

(56) References Cited

U.S. PATENT DOCUMENTS

| | | | |
|---|---|---|---|
| 2008/0316796 A1* | 12/2008 | Herner | G11C 11/36 365/148 |
| 2010/0157653 A1* | 6/2010 | Scheuerlein | G11C 11/56 365/148 |
| 2012/0181500 A1* | 7/2012 | Tsuji | H01L 45/04 257/4 |
| 2013/0126867 A1 | 5/2013 | Wang et al. | |
| 2017/0179144 A1* | 6/2017 | Han | H01L 21/76877 |

\* cited by examiner

Top View of Array of 8 Base Cells
Arrayed in an overlapping configuration

Top View of Base Cell

Top View of Array of 4 Base Cells
Arrayed in a non-overlapping configuration

LARGER-AREA INTEGRATED ELECTRICAL METALLIZATION DIELECTRIC STRUCTURES WITH STRESS-MANAGED UNIT CELLS FOR MORE CAPABLE EXTREME ENVIRONMENT SEMICONDUCTOR ELECTRONICS

CROSS REFERENCE TO RELATED APPLICATIONS

This application claims the benefit of U.S. Provisional Patent application, Ser. No. 62/297,381, entitled "LARGER-AREA INTEGRATED ELECTRICAL METALLIZATION DIELECTRIC STRUCTURES WITH STRESS-MANAGED UNIT CELLS FOR MORE CAPABLE EXTREME ENVIRONMENT SEMICONDUCTOR ELECTRONICS" and filed Feb. 19, 2016, which is hereby incorporated by reference herein.

ORIGIN OF THE INVENTION

The invention described herein was made by employees of the United States Government and may be manufactured and used by or for the Government for Government purposes without the payment of any royalties thereon or therefore.

FIELD OF THE INVENTION

The invention is in the field of semiconductor devices. In particular, semiconductor metal structures for use in extreme environments.

BACKGROUND

Patterned multiple layers of thin films of metal and dielectric to form integrated circuit interconnections of transistors and/or form on-chip circuit capacitors has been used semiconductor microelectronic fabrication. Differing layers of thin film materials have different physical and thermal expansion properties. Stress occurs in multilayer film structures on a microelectronic chip, and if the film materials have different coefficients of thermal expansion, larger temperature changes will impart larger stress between the films. The amount of stress changes with temperature and according to a function of lateral feature size/area across the microelectronic chip. When the stress imparted within a patterned metal film feature becomes critically large (e.g. the yield stress is exceeded), the metal film can physically crack, buckle, and/or delaminate from other layers in the microelectronic chip. The critical stress usually damages and/or fails the intended electrical operation of the microelectronic chip. The larger the temperature range of operation and/or the larger the lateral size of the patterned metal feature, the smaller the maximum force that a patterned metal feature in the microelectronic chip endures without buckling, yielding, and/or cracking.

This concern is accentuated for integrated circuits intended to function over a broad temperature range rather than conventional integrated circuits designed for conventional (e.g. room) temperature applications (e.g. computers and/or cell phones). It is difficult to avoid stress buildup and resulting in buckling, cracking, and/or delamination damage for extreme temperature integrated circuits. Since on-chip metal-insulator-metal capacitors typically require larger lateral area metal features (i.e., the metal plates of the on-chip capacitor), the stress buildup problem is particularly acute for these devices. Stress buildup that results in detrimental damage can also occur due to metal traces (e.g. interconnects) that carry electrical signals and power throughout integrated circuits.

FIGS. 1 and 2 illustrate a prior art conventional on-chip integrated metal-insulator-metal capacitor. The implementation of an on-chip metal-insulator-metal capacitor structure uses two metal plates that are separated by a dielectric. FIGS. 1 and 2 show a prior art implementation of such a structure using prior art, wherein a large simple metal interconnect shape is employed. The metal features are patterned into simple shapes that are predominantly circular or rectangular in nature around its outer periphery wherein the interior of the shape is completely occupied by the metal. The conventional chip shows a dielectric 102 deposited onto a substrate 104. A continuous metal shape 106 is deposited onto the dielectric 102. Another dielectric 108 is deposited onto the continuous metal shape 106 such that it is covered. FIG. 2 illustrates a second metal 202 deposited onto the second dielectric 108. A third dielectric 204 is deposited onto the second metal 202 to complete a metal-insulator-metal capacitor.

BRIEF DESCRIPTION

This brief description is provided to introduce a selection of concepts in a simplified form that are described below in the detailed description. This brief description is not intended to be an extensive overview of the claimed subject matter, identify key factors or essential features of the claimed subject matter, nor is it intended to be used to limit the scope of the claimed subject matter.

The innovation relates to fabrication and operation of semiconductor microelectronic circuits functional over broad operational temperature ranges. The innovation enables realization of larger lateral area metal features for integrated circuits (including on-chip metal-insulator-metal capacitors as well as interconnects that carry electrical signals throughout integrated circuits) that durably operate over a much larger (2-3X greater) temperature range.

Advantages exist for a metal unit cell array. One advantage resides in an improved management of stress. Another advantage resides in dividing a buildup of interfacial stress forces on metal films. Another advantage resides in anchor posts for absorbing and/or withstanding surrounding metal film stress. Yet another advantage resides in dielectric anchor posts that are mechanically strengthened by being anchored to an underlying dielectric film and an overlying dielectric film.

The following description and drawings set forth certain illustrative aspects and implementations. These are indicative of but a few of the various ways in which one or more aspects may be employed. Other aspects, advantages, or novel features of the disclosure will become apparent from the following detailed description when considered in conjunction with the drawings.

BRIEF DESCRIPTION OF THE DRAWINGS

The accompanying drawings, which are incorporated in and constitute a part of the specification, illustrate various systems, methods, and other embodiments of the disclosure. Illustrated element boundaries (e.g., boxes, groups of boxes, or other shapes) in the figures represent one example of the boundaries. In some examples one element may be designed as multiple elements or multiple elements may be designed as one element. In some examples, an element shown as an internal component of another element may be implemented as an external component and vice versa.

DETAILED DESCRIPTION

Figure 1:
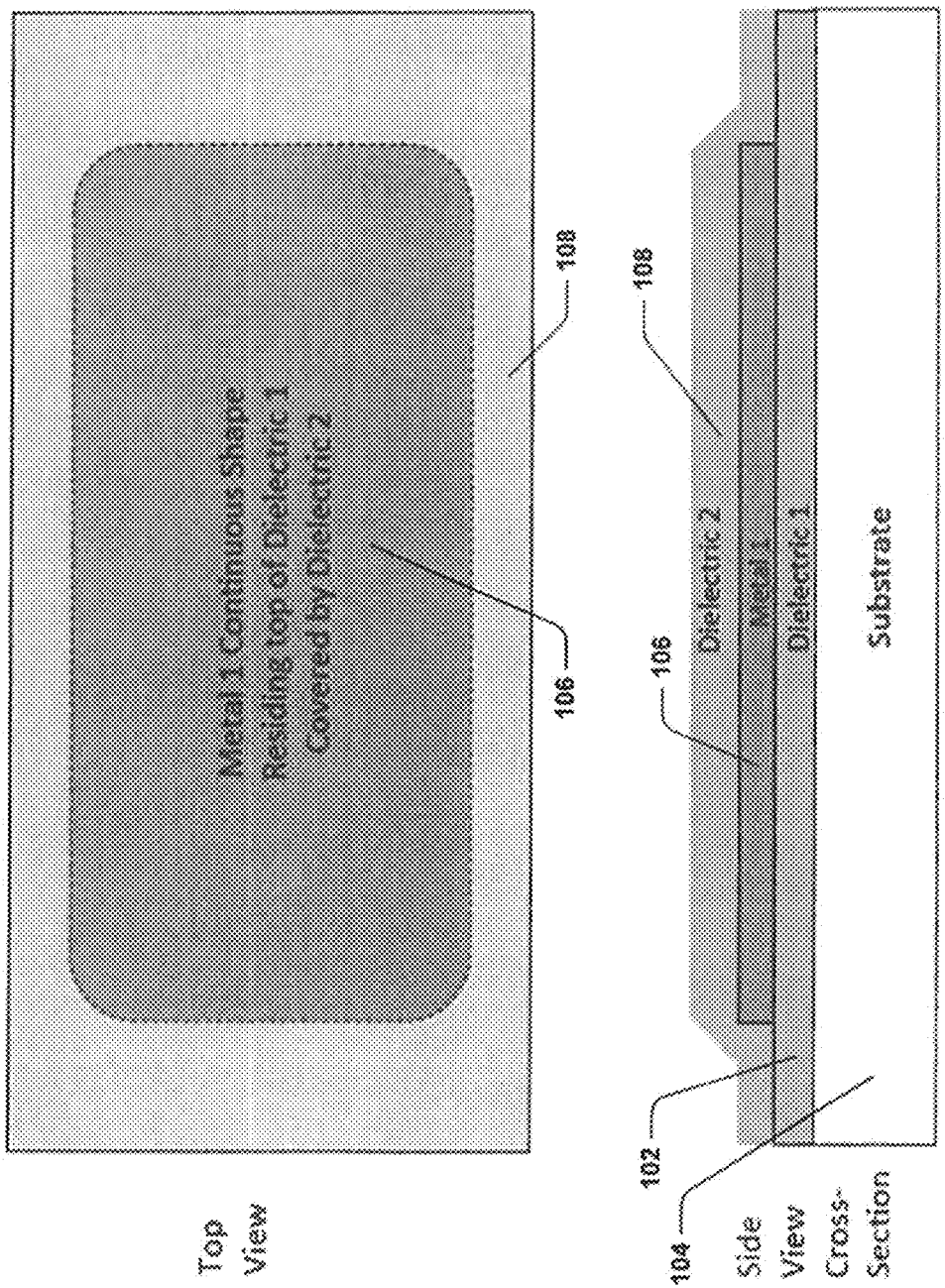
FIGS. 1-2 illustrate a prior art solid metal plate capacitor.
Figure 2:
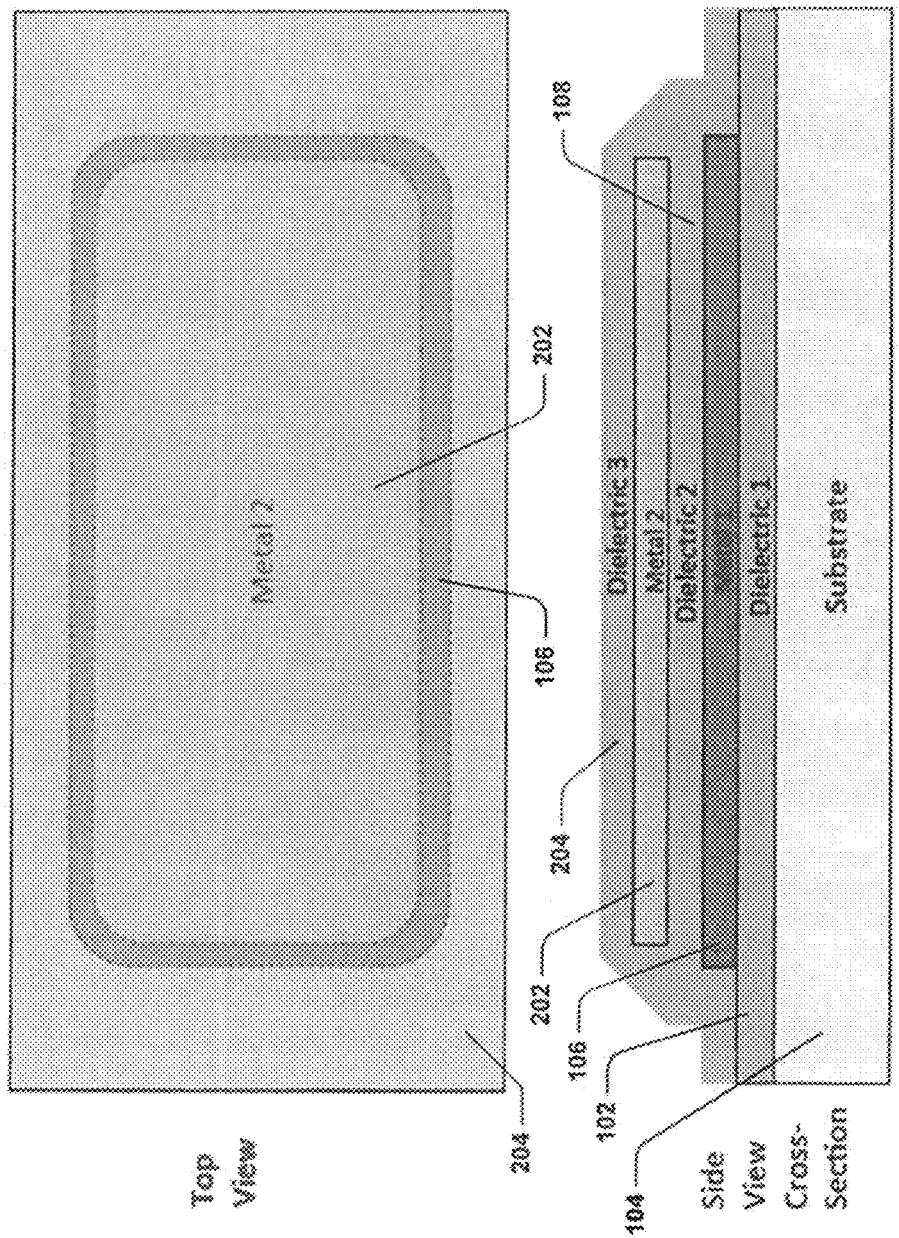

Embodiments or examples illustrated in the drawings are disclosed below using specific language. It will nevertheless be understood that the embodiments or examples are not intended to be limiting. Any alterations and modifications in the disclosed embodiments and any further applications of the principles disclosed in this document are contemplated as would normally occur to one of ordinary skill in the pertinent art. Described herein are examples of systems, methods, and other embodiments associated with semiconductor devices in extreme environment microelectronic integrated devices.

Figure 3:
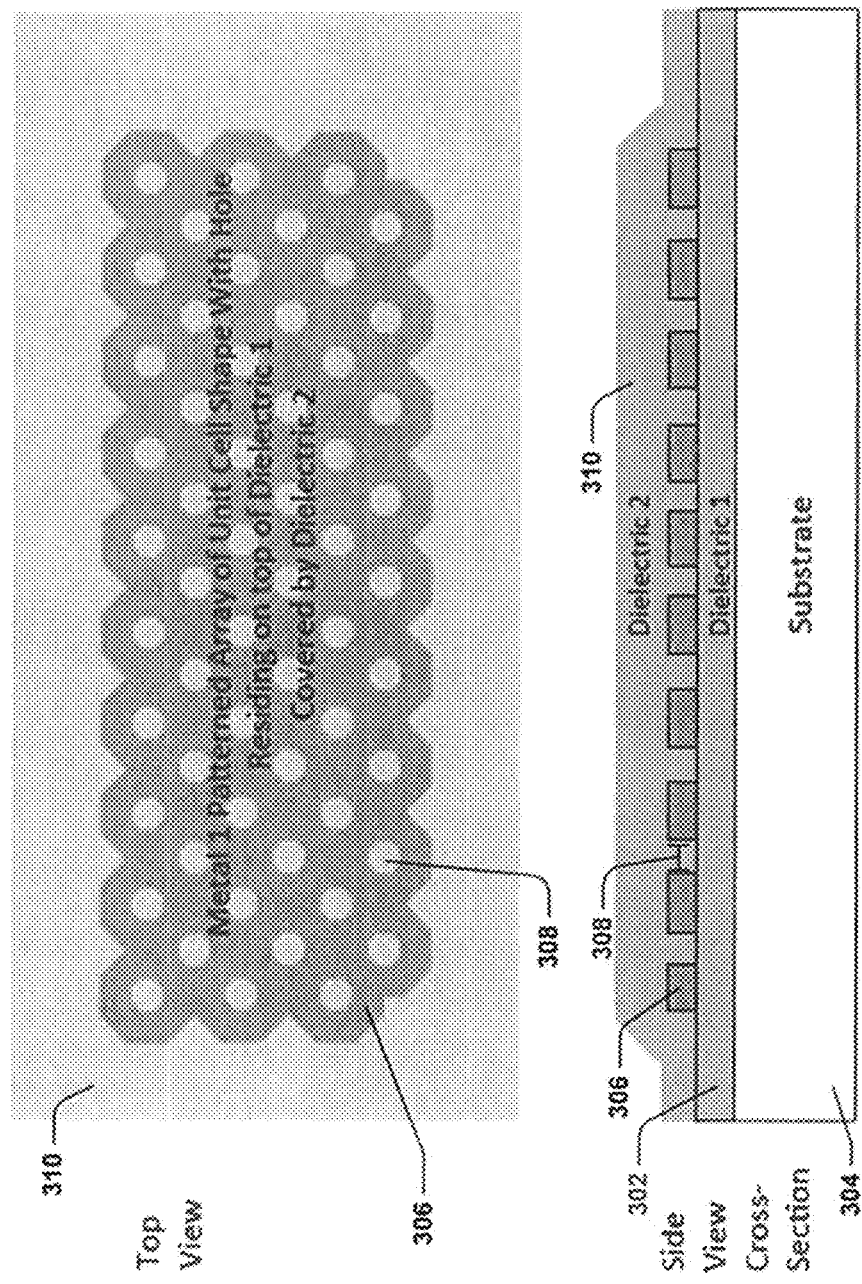
FIG. 3 illustrates an integrated device using patterns of metallization that have enclosed areas without metallization according to aspects.

FIG. 3 illustrates an integrated device (i.e., a device that could be part of a larger and more complex integrated circuit chip) using patterns of metallization that have areas without metallization residing in the interior of the metal periphery shape. The patterns mitigate stress effects in a large lateral area metal film (e.g. a plate) residing on dielectric in an integrated device or circuit. The integrated device includes a first insulating layer 302 deposited onto a substrate 304. In some embodiments, the first insulating layer 302 is a dielectric material. The dielectric material can be silicon dioxide (SiO2). A first metal unit cell array 306 is deposited onto the first insulating layer 302. The first metal unit cell array 306 is arranged (e.g. patterned by photolithography) such that non-metal holes 308 (e.g., regions devoid of metal) are formed within the periphery of the unit cell array 306. A second insulating layer 310 is deposited onto the first metal unit cell array 306 such that it is covered on top and the holes 308 are filled with the second insulating layer 310. In some embodiments, the second insulating layer 310 is a dielectric material. In some embodiments, the dielectric material can be made of SiO2.

In some embodiments, the hole 308 is filled forming the connection (e.g. intersection) of the underlying first insulating layer 304 and the overlying second insulating layer 310. The connection forms insulating layer "anchor posts" in the hole 308 of the base unit cell 402. The metal array 306 is protectively covered by overlaying the second insulating layer 310.

Figure 4:
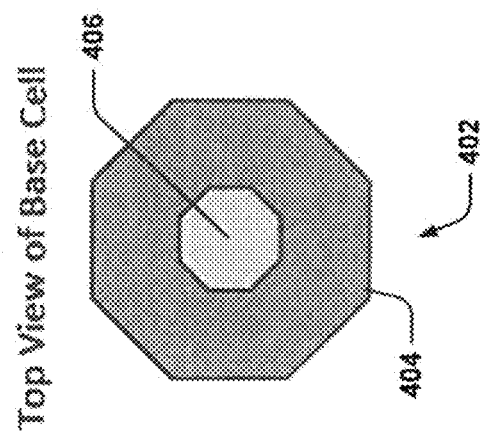
FIG. 4 illustrates a view of a base unit cell according to aspects.

FIG. 4 illustrates a close up view of a base unit cell 402 (e.g. a singular cell that is combined with other base cells to complete the metal array 306 described). The base unit cell 402 includes an outer metal periphery 404. In some embodiments, the outer metal periphery 404 is made of a conductive metal for use in a semiconductor device and/or integrated devices. The outer metal periphery 404 includes at least 4 sides. In some embodiments, the outer metal periphery 404 includes 8 sides on the outer periphery. The interior metal border that defines the shape of the interior border of the non-metal hole 406 of the base unit cell 402 pattern is comprised of at least 4 sides. In some embodiments, the interior border of the base unit cell 402 has 8 sides.

The base unit cell 402 includes a hole 406 that is a lateral hollow interior region. The hole 406 is devoid of metal. The hole 406 is occupied by an insulating layer (e.g. an insulating film) that insulates and/or protects metal arrays described herein. In some embodiments, the hole 406 has a lateral area that is 10% to 70% of the lateral area of the base unit cell 402. In some embodiments, the width dimension of the metal between the edge of the hole 406 and the edge of the base unit cell 402 is less than the length that would result in cracking, buckling, and/or delamination of the metal array 306 over the entire intended temperature range of operation.

In some embodiments, the metal array 306 is made of one base unit cell having a hole (or holes). In other embodiments, the metal array 306 is made of multiple base unit cells.

Figure 5:
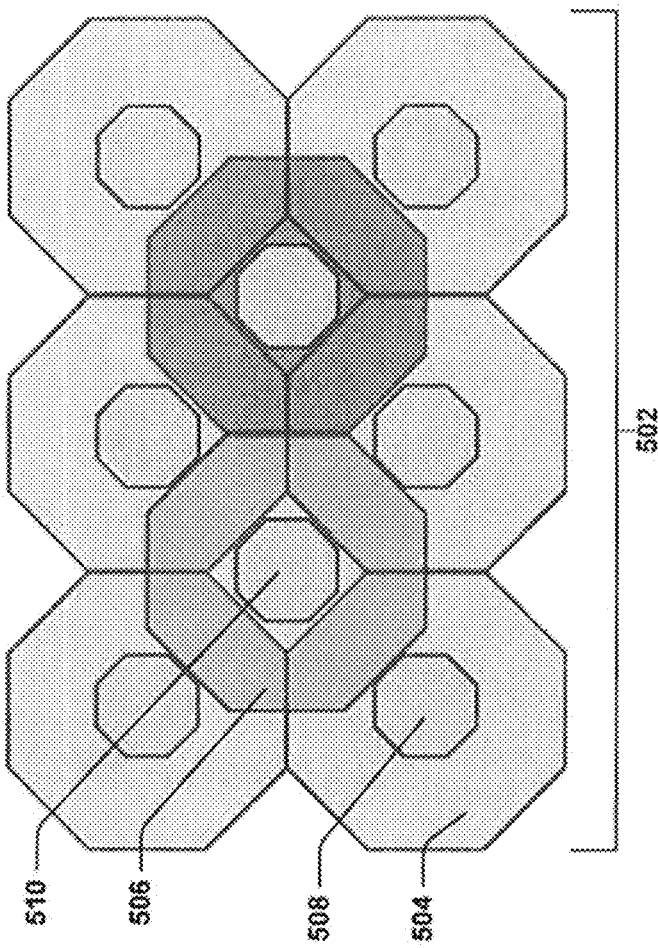
FIGS. 5-6 illustrate configurations of multiple base unit cells.

FIG. 5 illustrates on particular configuration of multiple base unit cells 502 arrayed adjacently and physically connected to one another to create a larger metal array. The base unit cells 502 can be arranged in an overlapping configuration of 8 cells. The 8 cells are arranged with 6 underlying cells 504 in a 3×2 configuration and 2 overlaying cells 506 that are overlaid such that the metal part of the overlaying cells 506 does not overlap the holes of the underlying cells 508. The overlaying cells 506 are overlaid such that the holes 510 of the overlaying cells 504 do not overlap the metal of the underlying cells 504. In some embodiments, the 8 cell configuration can be repeated and connected to other 8 cell configurations, or other cell configurations, to form a larger metal array according to integrated device specifications.

Figure 6:
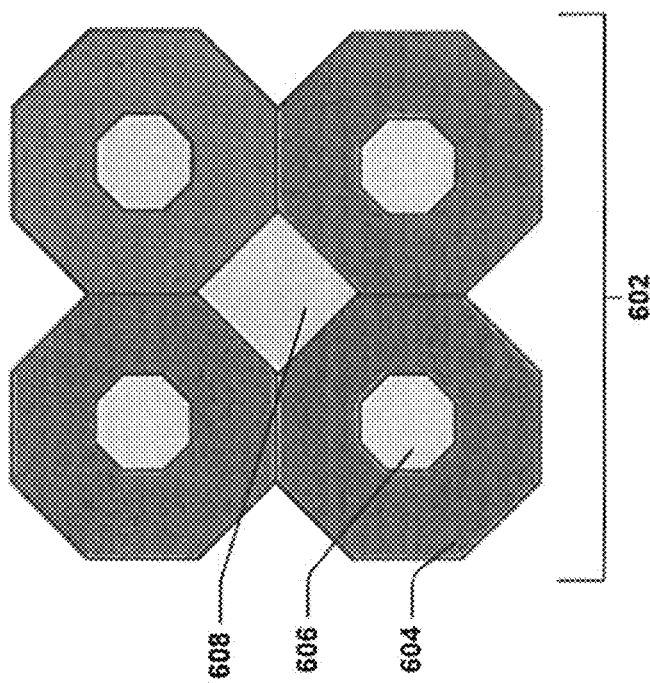

FIG. 6 illustrates another configuration of multiple base unit cells 402 arrayed adjacently and physically connected to one another to create the metal array 602. The base unit cells 402 can be arranged in a non-overlapping configuration of 4 cells 604. The non-overlapping cells 604 are connected on common side edges of the metal outer periphery and include holes 606 of each non-overlapping cell 604. The configuration creates an inherent hole 608 in the center of the 4 non-overlapping cells. In some embodiments, the 4 cell configuration can be repeated and connected to other 4 cell configurations, or other cell configurations, to form a larger metal array 306 according to device specifications.

Figure 7:
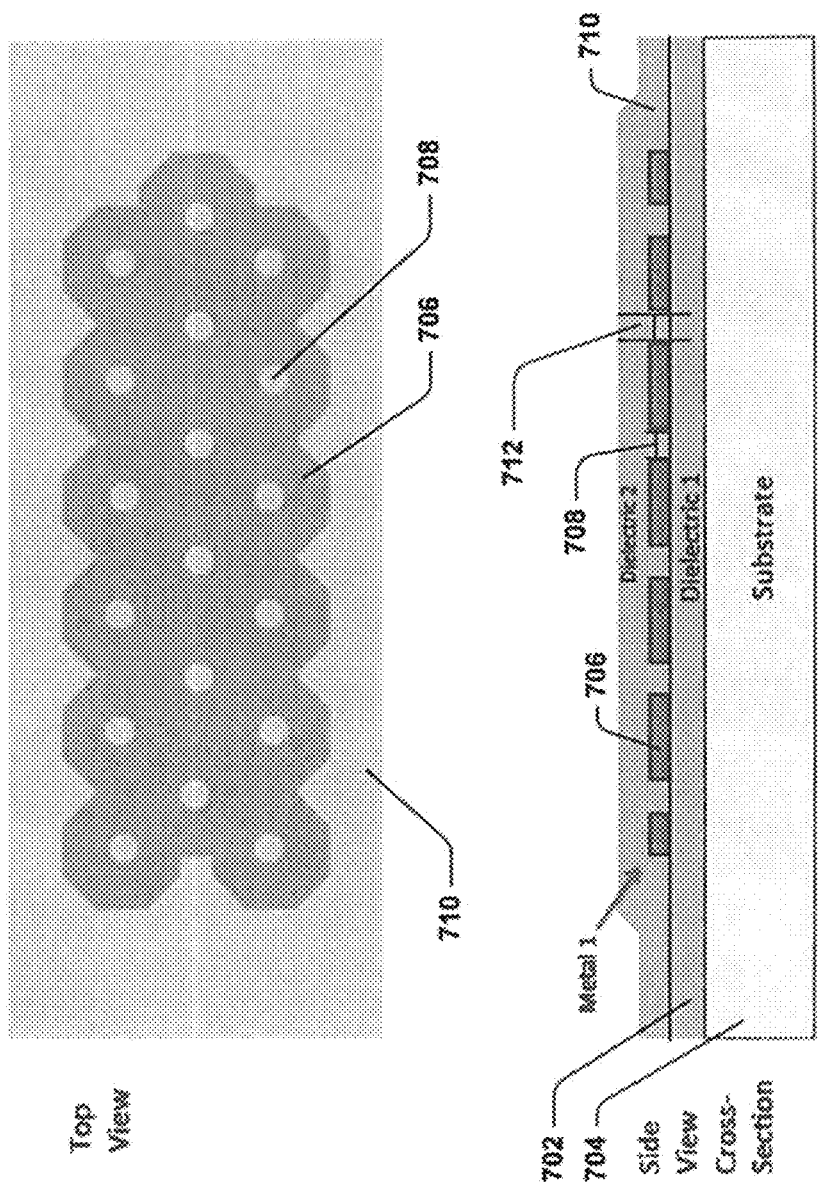
FIGS. 7-8 illustrate diagrams of intermediary steps in a fabrication process of an integrated device according to aspects herein.

FIGS. 7-10 illustrate an implementation of an on-chip (i.e., integrated) metal-insulator-metal capacitor device using metal arrays for increased stress durability. FIG. 7 illustrates formation of a metal unit cell array of an integrated device. The integrated device includes a first insulating layer 702 deposited onto a substrate 704. In some embodiments, the first insulating layer 702 is a dielectric material. In some embodiments, the dielectric material can be made of SiO2. A metal unit cell array 706 is deposited (and patterned using photolithography) onto the first insulating layer 702. The metal unit cell array 706 is arranged (e.g. patterned) such that a first set of non-metal holes 708 are formed within the periphery of the metal unit cell array 706. A second insulating layer 710 is deposited onto the metal unit cell array 706 such that it is covered on top and the holes 708 are filled with the second insulating layer 710. In some embodiments, the second insulating layer 710 is a dielectric material. In some embodiments, the dielectric material can be made of SiO2. In some embodiments, the first insulating layer 702 and the second insulating layer 710 bond to form an insulating anchor post 712 in the holes 708.

Figure 8:
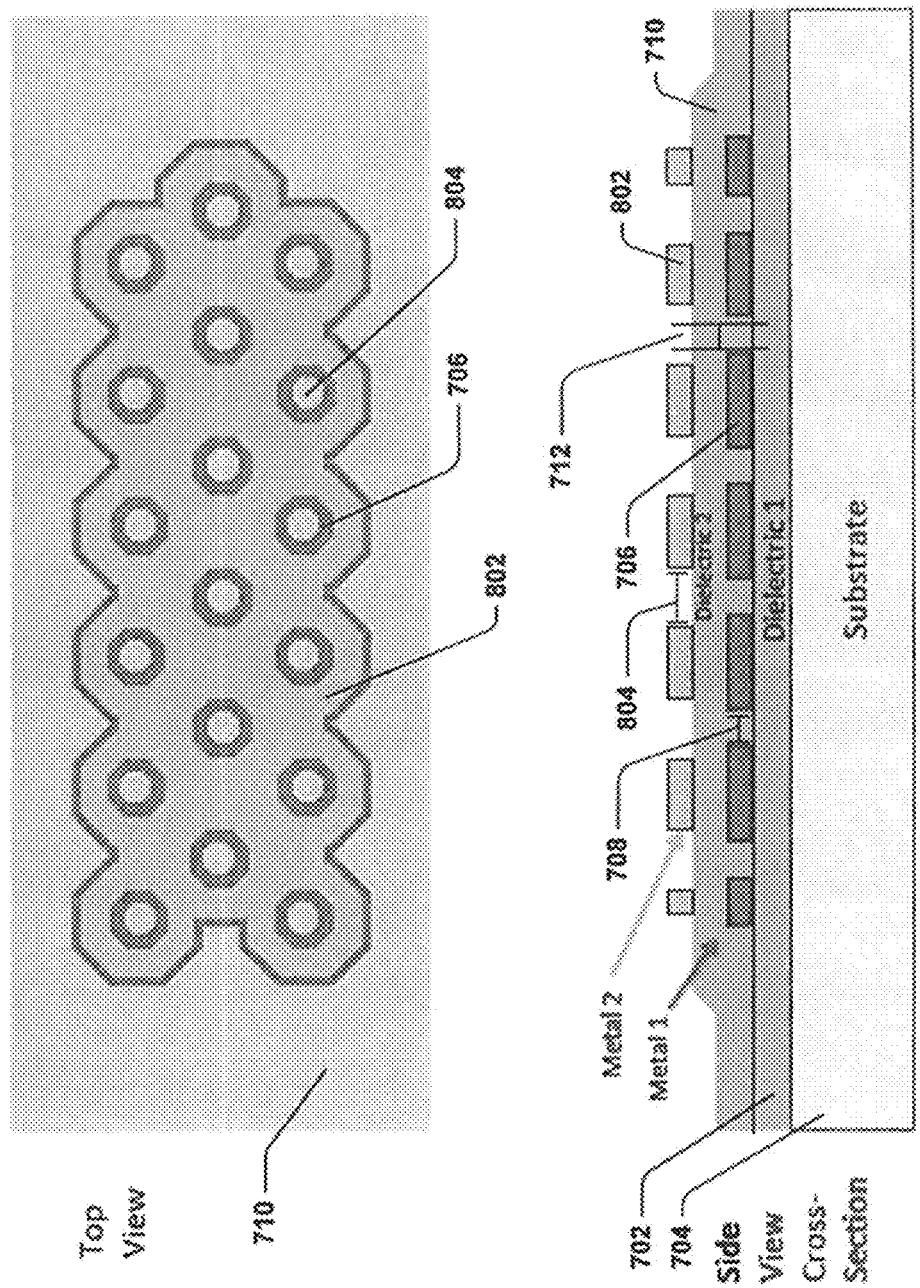

FIG. 8 illustrates the patterning of a second metal unit cell array 802 on top of the second insulating layer 710. The second metal unit cell array 802 includes a second set of non-metal holes 804. In some embodiments, the second metal unit cell array 802 is aligned and patterned such that the second metal unit cell array 802 exclusively resides in regions directly over the first metal unit cell array 706 pattern. The second metal unit cell array 802 is aligned and patterned such that the first set of non-metal holes 708 exclusively resides in regions directly under the second set of non-metal holes 804 pattern. In some embodiments, the second metal unit cell array 802 pattern is slightly smaller in lateral dimensions than the lateral extent of the first metal unit cell array 706 pattern. The lateral dimensional shrinkage is ensures that no part of the second metal unit cell array 802 resides in lateral areas where the first metal unit cell array 706 is not underlying. The lateral dimensional shrinkage allows a finite pattern (e.g. mask) alignment tolerance error that can arise from separate respective patterning of the first metal unit cell array 706 and the second metal unit cell array 802.

Figure 9:
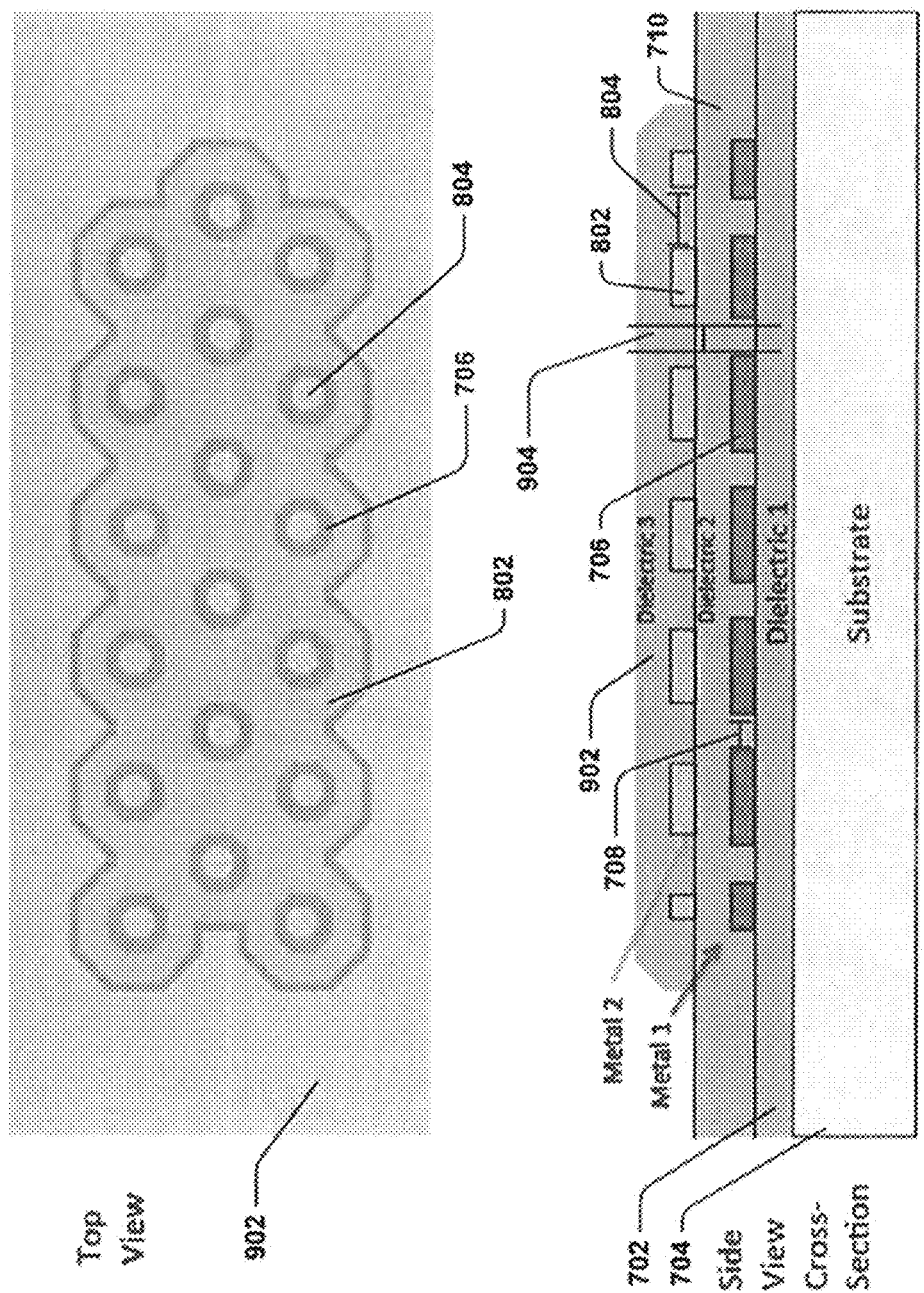
FIG. 9 illustrates a completed integrated device according to aspects herein.

FIG. 9 illustrates an embodiment of a metal-insulator-metal capacitor device. The fabrication includes a deposition of an overlaying third insulating layer 902. The third insulating layer 902 seals the device and protects the device from atmospheric conditions. In some embodiments, the third insulating layer 902 is a dielectric material. In some embodiments, the dielectric material can be made of SiO2. In some embodiments, the third insulating layer 902 can be comprised of multiple films of dielectric material. The hole alignment filled with the insulating layers creates anchor posts 904 that strengthen the integrated device structure. The structure depicted can successfully enable realization of increased durability in the face of increased stress over a broad range of temperatures.

Figure 10:
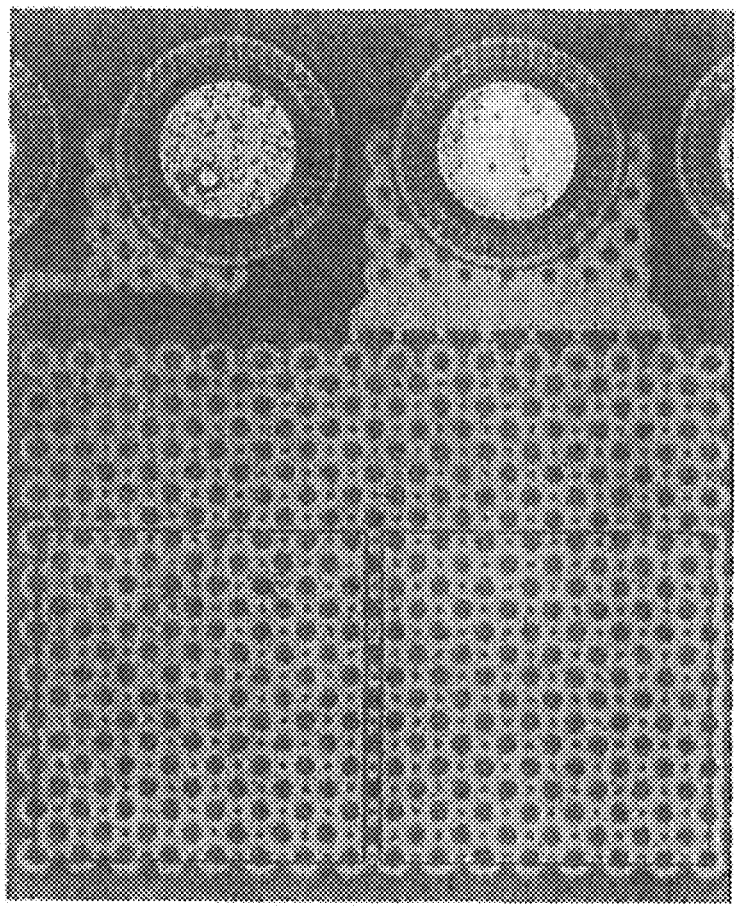
FIG. 10 shows an optical micrograph of an embodiment of the structure of FIG. 9. Optical micrograph of part of large-area extreme-temperature Metal-insulator-metal on-chip capacitor successfully implemented using the present invention. Gold bond pads at right are 160 um diameter. Both levels of metal (i.e., Metal 1 and Metal 2) are patterned according to present invention.

FIG. 10 depicts an experimental embodiment of a stress-managed metal-insulator-metal capacitor structure implemented for an extreme-environment integrated device process. The capacitor structure is constructed over a large lateral area on a substrate. The capacitor structure has been shown to withstand temperatures above 700 degrees Celsius (C) without significant cracking, buckling, and/or delamination to the structure. In some embodiments, the first metal unit cell array and the second metal unit cell array are made of tantalum silicide (TaSi2). The first metal unit cell array and the second metal unit cell array can be about 0.8 micrometers thick. The first metal unit cell array and the second metal unit cell array can be sputter deposited via a close-proximity (e.g. target to substrate distance of less than 3 cm) sputter deposition process. In some embodiments, the insulating layers can be about 1 micrometer thick. In some embodiments, the insulating layers can be made of SiO2. The insulating layers can be deposited at 720 C using a low-pressure chemical vapor deposition (LPCVD). In some embodiments, the LPCVD can employ a tetraethyl orthosilicate (TEOS) precursor. In another embodiment, the metal is comprised of refractory high temperature metallization (such as TaSi2) and the insulating layers are made of deposited dielectric SiO2 film.

It is appreciated that while simplified cross-sectional side views of the metals and capacitors illustrated depict the device fabricated on a completely flat starting substrate, the innovation can be successfully implemented on non-flat substrates with significant (e.g. comparable to insulating layer and metal film thicknesses) vertical microscopic topology. For example, the embodiment shown in FIG. 10 was fabricated on top of an SiC substrate with patterned square mesa features of over 0.5 microns in height.

Figure 11:
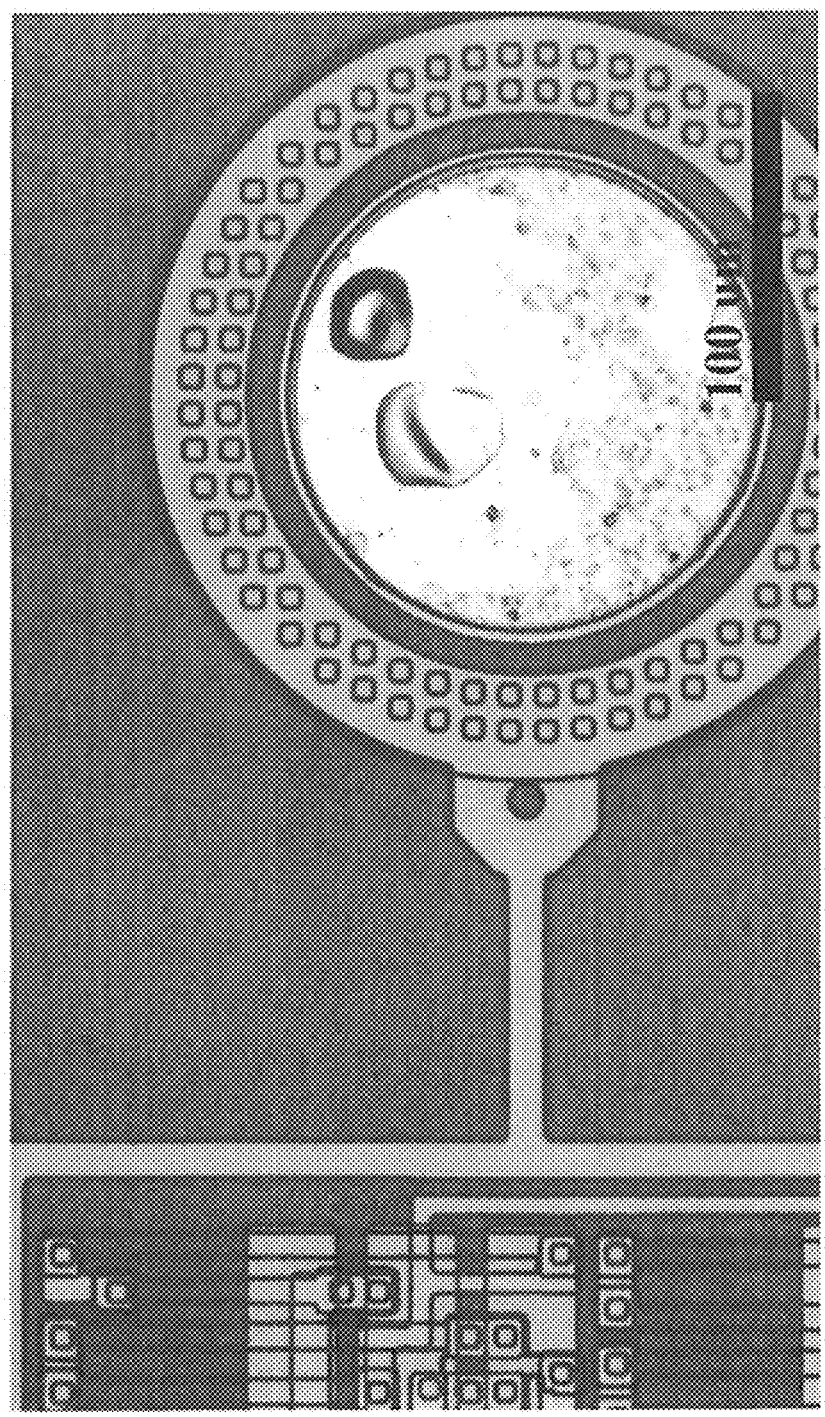
FIG. 11 shows an optical micrograph of an embodiment.

FIG. 11 depicts an experimental embodiment of a stress-managed interconnect trace structure implemented for an extreme-environment integrated device process. In the embodiment, the array is comprised of a single base unit cell. The base unit cell manages stress where a metal interconnect trace attaches to a larger bonding pad metallization. In some embodiments, the metal trace, the base unit cell with metal hole, and bonding pad metallization are implemented in the same (e.g. single) deposited and patterned metal film layer that has underlying and overlying dielectric layers.

Figure 12:
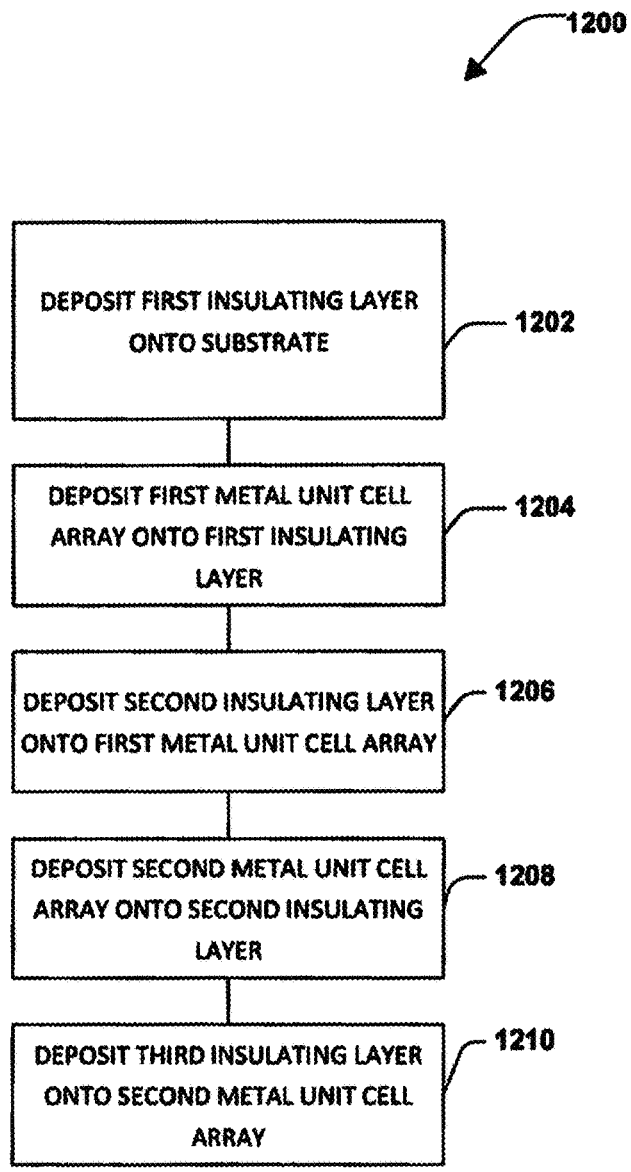
FIG. 12 illustrates a method for fabricating an integrated device according to aspects.

FIG. 12 illustrates a method 1200 for fabricating an integrated device. At 1202, a first insulating layer is deposited onto a substrate. At 1204, a first metal unit cell array having a first set of holes is deposited onto the first insulating layer. At 1206, a second insulating layer is deposited onto the first metal unit cell array and a portion of the first insulating layer. At 1208, a second metal unit cell array having a second set of holes is deposited onto the second insulating layer. At 1210, a third insulating layer is deposited onto the second metal unit cell array and a portion of the second insulating layer.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks. The methods described herein are limited to statutory subject matter under 35 U.S.C § 101.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims, which satisfy the statutory subject matter requirements of 35 U.S.C. § 101.

Various operations of embodiments are provided herein. The order in which one or more all of the operations are described should not be construed as to imply that these operations are necessarily order dependent. Alternative ordering will be appreciated based on this description. Further, not all operations may necessarily be present in each embodiment provided herein.

As used in this application, "or" is intended to mean an inclusive "or" rather than an exclusive "or". Further, an inclusive "or" may include any combination thereof (e.g., A, B, or any combination thereof). In addition, "a" and "an" as used in this application are generally construed to mean "one or more" unless specified otherwise or clear from context to be directed to a singular form. Additionally, at least one of A and B and/or the like generally means A or B or both A and B. Further, to the extent that "includes", "having", "has", "with", or variants thereof are used in either the detailed description or the claims, such terms are intended to be inclusive in a manner similar to the term "comprising".

Further, unless specified otherwise, "first", "second", or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. An integrated device having a plurality of layers, the layers comprising:
   a substrate;
   a first insulating layer deposited directly onto the substrate;
   a first metal unit cell array deposited directly onto the first insulating layer, wherein the first metal unit cell array comprises a first metal layer including a first plurality of apertures extending completely through the first metal layer such that a portion of the first insulating layer is completely covered by the first metal layer and a portion of the first insulating layer is completely covered by the first plurality of apertures; and
   a second insulating layer deposited directly onto the first metal unit cell array and a portion of the first insulating layer, wherein the second insulating layer completely covers the first metal unit cell array, wherein the second insulating layer directly contacts the first insulating layer by extending through at least some of the first plurality of apertures.

2. The integrated device of claim 1, further comprising:
   a second metal unit cell array deposited directly onto the second insulating layer; and
   a third insulating layer deposited directly onto the second metal unit cell array and a portion of the second insulating layer, wherein the third insulating layer extends over centers of at least some of the first plurality of apertures, wherein the third insulating layer directly contacts the second insulating layer.

3. The integrated device of claim 2, wherein the first metal unit cell array significantly overlaps the second metal unit cell array.

4. The integrated device of claim 3, wherein the second metal unit cell array is laterally shrunken to a degree smaller than the first metal unit cell array such that all of the second metal unit cell array resides in lateral areas where the first metal unit cell array is underlying.

5. The integrated device of claim 2, wherein the second metal unit cell array comprises a second metal layer including second plurality of apertures.

6. The integrated device of claim 5, wherein the first plurality of apertures is filled by the second insulating layer and the second plurality of apertures is filled by the third insulating layer.

7. The integrated device of claim 6, wherein the second plurality of apertures is laterally shrunken to a degree smaller than the first plurality of apertures such that all of the second plurality of apertures resides in lateral areas where the first plurality of apertures is underlying to form anchor posts filled with a combination of the second insulating layer and the third insulating layer.

8. The integrated device of claim 7, wherein the overlapped first plurality of apertures and second plurality of apertures divide a buildup of interfacial stress forces on the integrated device.

9. The integrated device of claim 2, wherein first metal unit cell array and the second metal unit cell array are made of tantalum silicide.

10. The integrated device of claim 2, wherein the first metal unit cell array and the second metal unit cell array are 0.8 micrometers thick.

11. The integrated device of claim 2, wherein the integrated device forms a capacitor.

12. The integrated device of claim 1, wherein the first metal unit cell array is made of at least one base unit cell.

13. The integrated device of claim 12, wherein the at least one base unit cell is comprised of at least one hole region that is devoid of metal and is laterally enclosed by a metal to form a surrounding metal region.

14. The integrated device of claim 12, wherein the at least one base unit cell is organized in a repeating non-overlapping four-cell array.

* * * * *